United States Patent [19]

Faul et al.

[11] 4,240,888

[45] Dec. 23, 1980

[54] METHOD OF ELECTROCHEMICALLY PROCESSING METALLIC SURFACES OF WORKPIECES

[75] Inventors: Wolfgang Faul; Leander Fürst, both of Jülich; Bertel Kastening, Hamburg, all of Fed. Rep. of Germany

[73] Assignee: Kernforschungsanlage Jülich Gesellschaft mit beschränkter Haftung, Jülich, Fed. Rep. of Germany

[21] Appl. No.: 96,138

[22] Filed: Nov. 20, 1979

[30] Foreign Application Priority Data

Nov. 22, 1978 [DE] Fed. Rep. of Germany ....... 2850605

[51] Int. Cl.³ .......................... C25F 3/02; C25F 3/14
[52] U.S. Cl. .............................................. 204/129.75
[58] Field of Search ............ 204/129.1, 129.75, 129.6, 204/129.65, 129.7

[56] References Cited

U.S. PATENT DOCUMENTS 3,974,050  8/1976  Divisek .............................. 204/129.6
4,131,523  12/1978  Faul ................... 204/129.1

Primary Examiner—T. M. Tufariello
Attorney, Agent, or Firm—Becker & Becker, Inc.

[57] ABSTRACT

Method of electrochemically processing metallic surfaces of workpieces which are arranged in an electrolyte of an electrolysis cell in such a way that the workpiece does not contact the anode and the cathode, with pulverous particles of one of the group consisting of graphite and activated carbon being suspended in the electrolyte, with the pulverous particles being charged on the anode for transfer of an electric charge to the workpiece. The pulverous particles are shielded by a diaphragm or an ion exchange membrane so that the charged pulverous particles cannot discharge at the cathode. In the electrolyte there is dissolved one of the group consisting of a $V^{+5}$ compound and a vanadium-containing compound adapted to form $V^{+5}$ ions at the anode of the electrolysis cell.

4 Claims, 1 Drawing Figure

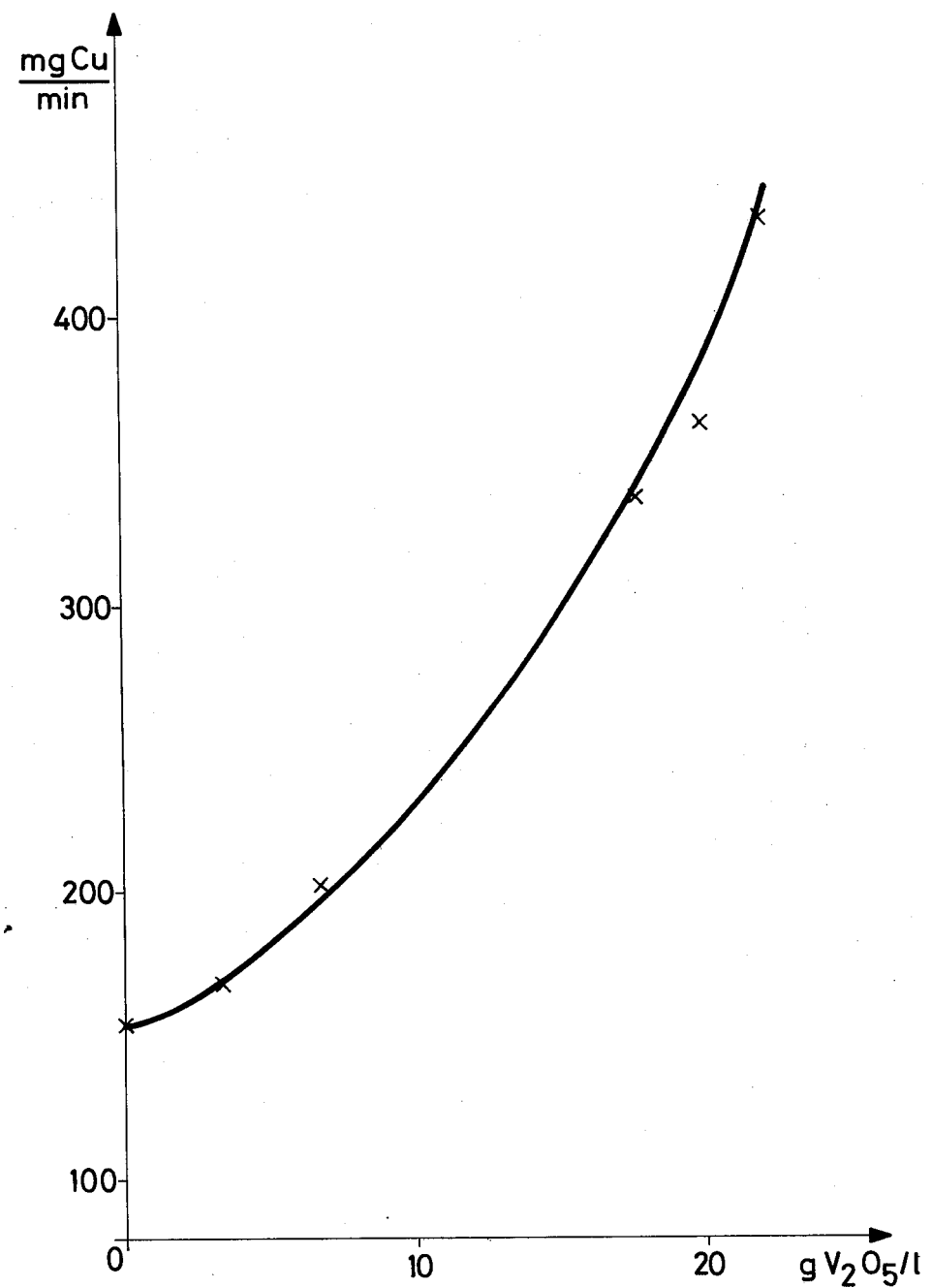

METHOD OF ELECTROCHEMICALLY PROCESSING METALLIC SURFACES OF WORKPIECES

The present invention relates to a method of electrochemically processing metallic surfaces of workpieces with an electrolyte in an electrolysis cell having an anode and a cathode, whereby the workpiece is arranged in such a way so as not to contact the anode and the cathode. In the electrolyte there are suspended pulverous particles of one of the group consisting of graphite and activated carbon, for transfer of an electric charge. The particles are charged at the anode of the electrolysis cell, and discharge thereof at the cathode is prevented by a diaphragm or ion exchange membrane arranged between the cathode and anode.

For one thing, this method is useful in the manufacture of printed circuits whereby copper is removed from copper plates of plastic or synthetic material, which plates are coated with copper on one or two sides, whereby the copper is removed in accordance with a previously applied coating from unprotected areas or regions. The coated areas subsequently form part of the circuitry. In this method the electrically conductive particles, suspended in the electrolyte, are positively recharged at the anode of an electrolysis cell and are subsequently, together with the electrolyte, in contact with the surface of the copper layer, whereby metal ions are introduced into the solution which are covered at the cathode of the electrolysis cell.

The method is also useful for producing metallic form-parts which demand a high degree of precision and accuracy of pertaining contours, for example, parts which are adapted to guide a flow, such as turbine vanes or nozzles, but also for the shaping of the surface of printing plates or cylinders.

The substantially immediate recovery, in accordance with this method, of removed metals which are recovered at the cathode provides for an economical and simultaneously environmentally beneficial method. The advantage of the method is also particularly utilized in the recovery of metals from so-called "cable scrap" (wire scrap).

In accordance with a known process graphite or activated pulverous carbon powders are suspended in an electrolyte, which particles are responsible for the transport, between the anode and the surface of the workpiece to be treated, of the charge required for removal of the metal. The charge transferred in this way is a function of the concentration of the conductive particles present in the electrolyte. The amount of particles suspended, in order to retain a sufficient fluidity of the electrolyte, is upwardly limited. This detrimentally affects a desirable increase of the rate of metal removed from the surface to be treated.

It is accordingly an object of the present invention to provide a method of electrochemically processing metallic surfaces of work-pieces wherein it is feasible to carry out the removal of metals from the metallic surfaces to be treated at a faster rate, without detrimentally affecting the viscosity of the electrolyte.

This object and other objects and advantages of the invention will appear more clearly from the following specification in connection with the accompanying drawing, in which the single figure is a diagram indicating the increase of the metal removal rate by the addition of vanadium to the electrolyte.

The method in accordance with the present invention is characterized primarily therein that in the electrolyte there is dissolved one of the group consisting of a $V^{+5}$ compound and a vanadium-containing compound adapted to form $V^{+5}$ ions on the anode of the electrolysis cell. By addition of $V^{+5}$ ions to the electrolyte, the metallic surface is not only electrochemically removed but also chemically etched. It is of advantage that the $V^{+4}$ ions formed during etching of the metal surface can again be oxidized to $V^{+5}$ at the anode of the electrolysis cell, so that electrolyte returned into the electrolysis cell after treating the surface can be regenerated with respect to the vanadium which is effective for the etching.

As vanadium compounds, for example vanadium trioxide or vanadyl sulfate are adapted to be dissolved in the electrolyte, both being adapted to form at the anode of the electrolysis cell five-valent vanadium. It is preferred to use vanadium pentoxide. A full solubility in the electrolyte is attained up to about 0.5 Mol vanadium pentoxide per liter of electrolyte.

The electrolyte in addition contains, as is known, aqueous sulfuric acid, ammonia, or ammonium carbonate. The concentration of the pulverous particles of one of the group consisting of graphite and activated carbon per liter of electrolyte amounts to from about 50 to about 250 g in accordance with the desired viscosity of the electrolyte. Economically optimal are concentrations of from 150 to 200 g graphite or activated carbon powder per liter of electrolyte.

The invention is further described with reference to examples and on the basis of the drawing. The drawing diagrammatically indicates the increase of the metal removal velocity by addition of vanadium to the electrolyte. In the diagram there is shown removal of copper from a copper surface, in mgCu/min, as a function of the content of vanadium pentoxide in the solution, in g $V_2O_5/l$.

Example 1

In an electrolyte, containing 1 Mol sulfuric acid per liter, activated pulverous carbon powder of a concentration of 15% by weight was suspended. The electrolyte was heated to 45° C. and sprayed by means of a flat-stream nozzle onto a copper plate. The loss in weight per unit time of the copper plate was measured. The resultant removal velocities were plotted as a function of the vanadium content in the electrolyte.

It is apparent that the removal velocity of copper increases with increasing vanadium content in the electrolyte. The removal is increased from 160 mgCu/min, with an electrolyte which does not contain vanadium pentoxide, to 434 mg Cu/min at a concentration of vanadium pentoxide of 22 g $V_2O_5/l$ in an electrolyte.

Example 2

In an alkaline electrolyte containing per liter: 150 g ammonium carbonate, 25 ml of a 25% aqueous ammonia solution, and 15% by weight activated pulverous carbon powder suspended in the electrolyte, vanadium pentoxide was dissolved with increasing concentration. When removing metal from a copper plate with electrolyte heated to about 50° C., but without adding vanadium pentoxide, a removal velocity of 104 mgCu/min was achieved. After adding 43 g $V_2O_5$ per liter electrolyte, the removal velocity increased to 124 mgCu/min.

An increase of the removal velocity by addition of vanadium pentoxide was attained in a similar manner also for electrolytes containing graphite or activated carbon powder in concentrations of the range of between 50 and 250 g per liter etching solution.

The present invention is, of course, in no way restricted to the specific disclosure of the specification and drawing, but also encompasses any modifications within the scope of the appended claims.

What we claim is:

1. A method of electrochemically processing metallic surfaces of workpieces in an electrolysis cell having an anode and a cathode, comprising the steps of:

providing in said electrolysis cell an electrolyte formed by: suspending in said electrolyte pulverous particles of one of the group consisting of graphite and activated carbon; and dissolving in said electrolyte one of the group consisting of a $V^{+5}$ compound and a vanadium-containing compound adapted to form $V^{+5}$ ions on said anode;

charging said pulverous particles on said anode so that said particles conduct an electric charge to said workpiece;

shielding said cathode so that said charged pulverous particles cannot discharge thereon; and bringing a workpiece into contact with said electrolyte in such a way that said workpiece does not contact said anode and said cathode.

2. A method according to claim 1, which includes the step of dissolving vanadium pentoxide in said electrolyte.

3. A method according to claim 1, and including the step of dissolving in said electrolyte a quantity of vanadium-containing compound equivalent to about 0.5 Mol $V_2O_5$ per liter of electrolyte.

4. A method according to claim 1, wherein said shielding includes providing between said anode and said cathode a partition selected from the group consisting of a diaphragm and an ion exchange membrane.

* * * * *